(12) United States Patent
Kilgore et al.

(10) Patent No.: US 10,656,689 B2
(45) Date of Patent: May 19, 2020

(54) ELECTRONIC DEVICE WITH A COOLING STRUCTURE

(71) Applicant: Google LLC, Mountain View, CA (US)

(72) Inventors: Adam Scott Kilgore, San Rafael, CA (US); Andrea Chantal Ashwood, Oakland, CA (US)

(73) Assignee: GOOGLE LLC, Mountain View, CA (US)

( * ) Notice: Subject to any disclaimer, the term of this patent is extended or adjusted under 35 U.S.C. 154(b) by 38 days.

(21) Appl. No.: 15/934,773

(22) Filed: Mar. 23, 2018

(65) Prior Publication Data

US 2018/0210521 A1 Jul. 26, 2018

Related U.S. Application Data

(63) Continuation of application No. 15/073,565, filed on Mar. 17, 2016, now Pat. No. 9,939,859.

(51) Int. Cl.
| | |
|---|---|
| *H04N 5/225* | (2006.01) |
| *G06F 1/20* | (2006.01) |
| *G08B 13/196* | (2006.01) |
| *H05K 7/20* | (2006.01) |

(52) U.S. Cl.
CPC ............ *G06F 1/203* (2013.01); *H04N 5/2252* (2013.01); *H04N 5/2254* (2013.01); *H04N 5/2257* (2013.01); *G05B 2219/2614* (2013.01); *G08B 13/19619* (2013.01); *H05K 7/20409* (2013.01)

(58) Field of Classification Search
None
See application file for complete search history.

(56) References Cited

U.S. PATENT DOCUMENTS

| | | | | |
|---|---|---|---|---|
| 4,780,799 A | * | 10/1988 | Groh | ................... F21V 19/0005 362/293 |
| 5,381,176 A | * | 1/1995 | Tanabe | ................. G11B 31/006 348/273 |
| 5,864,365 A | * | 1/1999 | Sramek | ............ G08B 13/19619 348/373 |
| 6,886,627 B2 | | 5/2005 | Kozyra et al. | |

(Continued)

FOREIGN PATENT DOCUMENTS

KR  10-2016-0009749  1/2016

*Primary Examiner* — Twyler L Haskins
*Assistant Examiner* — Wesley J Chiu
(74) *Attorney, Agent, or Firm* — Morgan, Lewis & Bockius LLP

(57) ABSTRACT

The various implementations described herein include systems and devices that comprise a cooling structure. In one aspect, a camera system comprises a cooling structure made from a thermally conductive material. The cooling structure has an exterior surface, an interior surface, a hollow portion, and a sidewall. The sidewall includes a through hole that penetrates the sidewall. The exterior surface includes surface features and is configured to radiate away from the cooling structure heat generated within the hollow portion that is transmitted from the interior surface to the exterior surface. The camera system further comprises a camera contained within the hollow portion of the cooling structure, a first electrical component that is embedded in the through hole, electrical components contained within the hollow portion, and an external housing that at least partially encloses the cooling structure.

19 Claims, 10 Drawing Sheets

(56) References Cited

U.S. PATENT DOCUMENTS

| | | | |
|---|---|---|---|
| 7,871,184 B2* | 1/2011 | Peng | F21K 9/233 |
| | | | 361/703 |
| 8,004,844 B2* | 8/2011 | Kim | H05K 7/20163 |
| | | | 361/716 |
| 8,354,779 B2 | 1/2013 | Falicoff et al. | |
| 9,206,973 B2* | 12/2015 | Fussell | F21S 6/003 |
| 10,212,816 B2* | 2/2019 | Rieke | H05K 7/20854 |
| 2005/0023273 A1 | 2/2005 | Fujisawa | |
| 2009/0134005 A1* | 5/2009 | Sato | C10B 33/10 |
| | | | 202/262 |
| 2010/0002383 A1* | 1/2010 | Yeh | G06F 1/181 |
| | | | 361/695 |
| 2010/0147496 A1 | 6/2010 | Liu | |
| 2010/0328466 A1* | 12/2010 | Erel | G08B 13/19619 |
| | | | 348/164 |
| 2014/0168507 A1* | 6/2014 | Renaud | H04N 5/2253 |
| | | | 348/373 |
| 2015/0273636 A1 | 10/2015 | Rajagopalan et al. | |
| 2016/0174408 A1* | 6/2016 | Tolbert | H05K 1/0209 |
| | | | 348/373 |
| 2017/0227208 A1* | 8/2017 | Bendtsen | F21V 17/16 |
| 2017/0264828 A1* | 9/2017 | Perez | H04N 5/2253 |

* cited by examiner

ELECTRONIC DEVICE WITH A COOLING STRUCTURE

RELATED APPLICATIONS

This application is a continuation of U.S. application Ser. No. 15/073,565, filed Mar. 17, 2016, entitled "Electronic Device with a Cooling Structure," which is hereby incorporated by reference in its entirety.

TECHNICAL FIELD

This relates generally to an electronic device assembly, and more particularly to methods and systems for packaging an electronic device with a cooling structure that is physically configured to improve efficiency of heat dissipation from the electronic device.

BACKGROUND

A smart home environment is created by integrating a plurality of smart devices, including intelligent, multi-sensing, network-connected devices, seamlessly with each other in a local area network and/or with a central server or a cloud-computing system to provide a variety of useful smart home functions. The smart devices have been developed to implement complicated functions and store/cache large amount of data locally, while having to maintain compact form factors (i.e., a number of functional modules of a smart device have to be packed tightly within the smart device). As the functions get complicated and the storage density increases, heat generated from the smart devices also increases. In the absence of effective and efficient heat dissipation mechanisms, this increased heat could compromise performance and cause failure of either individual functional modules or the entire smart device.

To dissipate heat generated by a tightly packed smart device, heat-generating functional modules of the smart device may make use of heat sinks that are coupled to a smart device or individual function modules of the smart device. The smart device or the functional modules may be mounted on top of heat sinks. Airflow from fans may pass by the surface of the heat sinks to help dissipate the heat. However, given the increasingly compact form factor, the combined heat dissipation effect of the heat sinks and the airflow is often insufficient. Thus, cooling systems normally have to include a large heat sink and/or operate their fans at high speeds, which results in noisier, less efficient, and more expensive systems that do not necessarily address the issue of insufficient heat dissipation throughout various smart devices. Therefore, it would be desirable to provide a cooling system that addresses the above mentioned problems.

SUMMARY

Accordingly, there is a need for integrating an electronic device with a cooling structure that dissipates heat generated in the electronic device effectively and efficiently. In various implementations of this application, an electronic device includes a plurality of electrical components, and a cooling structure made from a thermally conductive material and physically configured to at least partially enclose the electrical components. The cooling structure acts as a heat sink to dissipate heat generated by the electrical components.

More specifically, in accordance with one aspect of this application, an electronic device includes an enclosed cooling structure and a plurality of electrical components. The enclosed cooling structure is made from a thermally conductive material and has an exterior surface, an interior surface and a hollow portion defined by the interior surface. The exterior surface is configured to radiate away from the cooling structure heat generated within the hollow portion that is transmitted from the interior surface to the exterior surface. The plurality of electrical components is contained within the hollow portion, such that heat generated by the electrical components during operation of the electronic device is carried away from the electrical components by the cooling structure.

In some implementations, the exterior surface includes a base form and a plurality of surface features attached to the base form, and the plurality of surface features project away from the base form and are physically configured to increase rate of thermal radiation from the exterior surface. For example, the plurality of surface features include fins with a length that extends substantially from an air inlet to an air outlet of the cooling structure, and the fins are physically configured such that the plurality of fins form a helical structure that wraps around the cooling structure, resulting curved surfaces of the fins producing substantially constant acceleration and reducing pressure drop of the airflow moving across the fins.

In accordance with another aspect of this application, a camera system includes an enclosed cooling structure, a camera and a plurality of electrical components. The enclosed cooling structure is made from a thermally conductive material and has an exterior surface, an interior surface and a hollow portion defined by the interior surface. The exterior surface is configured to radiate away from the cooling structure heat generated within the hollow portion that is transmitted from the interior surface to the exterior surface. The camera lens and the plurality of electrical components are contained within the hollow portion. Heat generated by the electrical components during operation of the camera system is carried away from the electrical components by the cooling structure.

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to dissipate heat generated by electrical components integrated in an electronic device assembly (e.g., a camera system).

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

Like reference numerals refer to corresponding parts throughout the several views of the drawings.

DESCRIPTION OF IMPLEMENTATIONS

In accordance with various implementations of the present invention, a cooling structure is integrated in an electronic device that can be a smart device used in a smart home environment. It should be noted that the cooling structure defined herein can also be used in a conventional electronic device (i.e., other than a smart device). The electronic device includes, but is not limited to, a surveillance camera, a microphone, a speaker, a thermostat, a hazard detector, or other types of smart devices. The cooling structure is made from a thermally conductive material and at least partially encloses a plurality of electrical components that form the electronic device and dissipate heat during their operation. The cooling structure has an exterior surface, an interior surface and a hollow portion defined by the interior surface. The exterior surface is configured to radiate away from the cooling structure heat generated within the hollow portion that is transmitted from the interior surface to the exterior surface. At least a subset of electrical components of the electronic device is contained within the hollow portion, such that heat generated by the electrical components during operation of the electronic device is carried away from the electrical components by the cooling structure.

More specifically, the exterior surface of the cooling structure includes a base form and a plurality of surface features attached to the base form and configured to project away from the base form. A fan is disposed in proximity to a rear end of the cooling structure, such that the cooling structure includes an air inlet adjacent to the fan and an air outlet distant from the fan. In some implementations, the base form has a shape that is substantially conical, and is physically configured to provide very low air pressure drop of the airflow as it flows across the exterior surface from the air inlet to the air outlet of the cooling structure. It is noted that in some implementations the base form has a substantially radial (spherical) or cylindrical shape. Alternatively, in some implementations, the surface features of the cooling structure include fins. In some implementations, the fins form a helical structure that wraps around the cooling structure and extend substantially the air inlet to the air outlet of the cooling structure, resulting curved surfaces of the fins producing substantially constant acceleration and reducing pressure drop of the airflow moving across the fins.

Figure 1:
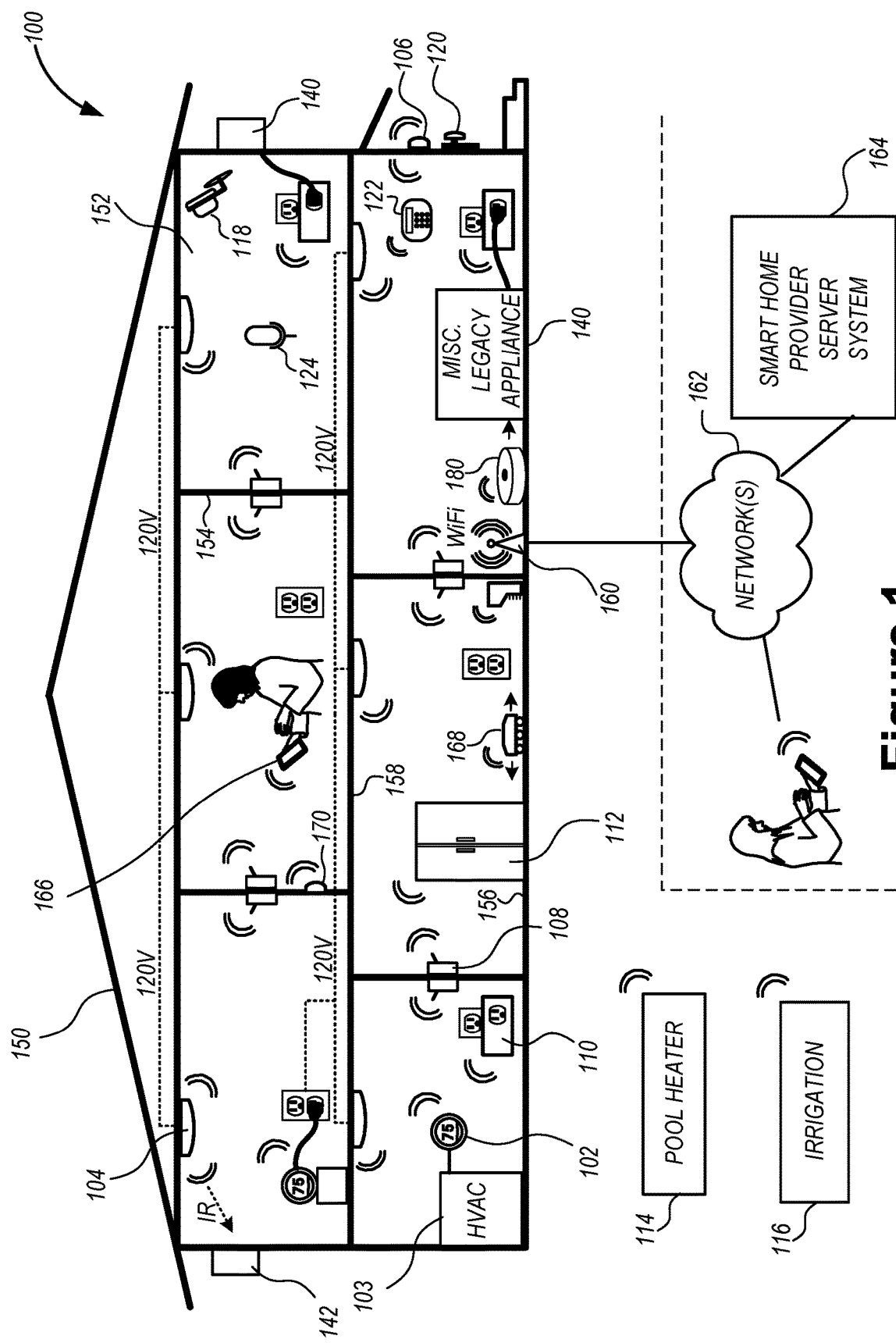
FIG. 1 is an example smart home environment in accordance with some implementations.

FIG. 1 is an example smart home environment 100 in accordance with some implementations. The smart home environment 100 includes a structure 150 (e.g., a house, office building, garage, or mobile home) with various integrated devices. It will be appreciated that devices may also be integrated into a smart home environment 100 that does not include an entire structure 150, such as an apartment, condominium, or office space. Further, the smart home environment 100 may control and/or be coupled to devices outside of the actual structure 150. Indeed, several devices in the smart home environment 100 need not be physically within the structure 150. For example, a device controlling a pool heater 114 or irrigation system 116 may be located outside of the structure 150.

The depicted structure 150 includes a plurality of rooms 152, separated at least partly from each other via walls 154. The walls 154 may include interior walls or exterior walls. Each room may further include a floor 156 and a ceiling 158. Devices may be mounted on, integrated with and/or supported by a wall 154, floor 156 or ceiling 158.

In some implementations, the integrated devices of the smart home environment 100 include intelligent, multi-sensing, network-connected devices that integrate seamlessly with each other in a smart home network and/or with a central server or a cloud-computing system to provide a variety of useful smart home functions. The smart home environment 100 may include one or more intelligent, multi-sensing, network-connected thermostats 102 (hereinafter referred to as "smart thermostats 102"), one or more intelligent, network-connected, multi-sensing hazard detection units 104 (hereinafter referred to as "smart hazard detectors 104"), one or more intelligent, multi-sensing, network-connected entryway interface devices 106 and 120 (hereinafter referred to as "smart doorbells 106" and "smart door locks 120"), and one or more intelligent, multi-sensing, network-connected alarm systems 122 (hereinafter referred to as "smart alarm systems 122").

In some implementations, the one or more smart thermostats 102 detect ambient climate characteristics (e.g., temperature and/or humidity) and control a HVAC system 103 accordingly. For example, a respective smart thermostat 102 includes an ambient temperature sensor.

The one or more smart hazard detectors 104 may include thermal radiation sensors directed at respective heat sources (e.g., a stove, oven, other appliances, a fireplace, etc.). For example, a smart hazard detector 104 in a kitchen includes a thermal radiation sensor directed at a stove/oven. A thermal radiation sensor may determine the temperature of the respective heat source (or a portion thereof) at which it is directed and may provide corresponding blackbody radiation data as output.

The smart doorbell 106 and/or the smart door lock 120 may detect a person's approach to or departure from a location (e.g., an outer door), control doorbell/door locking functionality (e.g., receive user inputs from a portable electronic device 166 to actuate bolt of the smart door lock 120), announce a person's approach or departure via audio or visual means, and/or control settings on a security system (e.g., to activate or deactivate the security system when occupants go and come).

The smart alarm system 122 may detect the presence of an individual within close proximity (e.g., using built-in IR sensors), sound an alarm (e.g., through a built-in speaker, or by sending commands to one or more external speakers), and send notifications to entities or users within/outside of the smart home network 100. In some implementations, the smart alarm system 122 also includes one or more input devices or sensors (e.g., keypad, biometric scanner, NFC transceiver, microphone) for verifying the identity of a user, and one or more output devices (e.g., display, speaker). In some implementations, the smart alarm system 122 may also be set to an "armed" mode, such that detection of a trigger condition or event causes the alarm to be sounded unless a disarming action is performed.

In some implementations, the smart home environment 100 includes one or more intelligent, multi-sensing, network-connected wall switches 108 (hereinafter referred to as "smart wall switches 108"), along with one or more intelligent, multi-sensing, network-connected wall plug interfaces 110 (hereinafter referred to as "smart wall plugs 110"). The smart wall switches 108 may detect ambient lighting conditions, detect room-occupancy states, and control a power and/or dim state of one or more lights. In some instances, smart wall switches 108 may also control a power state or speed of a fan, such as a ceiling fan. The smart wall plugs 110 may detect occupancy of a room or enclosure and control supply of power to one or more wall plugs (e.g., such that power is not supplied to the plug if nobody is at home).

In some implementations, the smart home environment 100 of FIG. 1 includes a plurality of intelligent, multi-sensing, network-connected appliances 112 (hereinafter referred to as "smart appliances 112"), such as refrigerators, stoves, ovens, televisions, washers, dryers, lights, stereos, intercom systems, garage-door openers, floor fans, ceiling fans, wall air conditioners, pool heaters, irrigation systems, security systems, space heaters, window AC units, motorized duct vents, and so forth. In some implementations, when plugged in, an appliance may announce itself to the smart home network, such as by indicating what type of appliance it is, and it may automatically integrate with the controls of the smart home. Such communication by the appliance to the smart home may be facilitated by either a wired or wireless communication protocol. The smart home may also include a variety of non-communicating legacy appliances 140, such as old conventional washer/dryers, refrigerators, and the like, which may be controlled by smart wall plugs 110. The smart home environment 100 may further include a variety of partially communicating legacy appliances, such as infrared ("IR") controlled wall air conditioners or other IR-controlled devices, which may be controlled by IR signals provided by the smart hazard detectors 104 or the smart wall switches 108.

In some implementations, the smart home environment 100 includes one or more network-connected cameras 118 that are configured to provide video monitoring and security in the smart home environment 100. The cameras 118 may be used to determine occupancy of the structure 150 and/or particular rooms 152 in the structure 150, and thus may act as occupancy sensors. For example, video captured by the cameras 118 may be processed to identify the presence of an occupant in the structure 150 (e.g., in a particular room 152). Specific individuals may be identified based, for example, on their appearance (e.g., height, face) and/or movement (e.g., their walk/gait). Cameras 118 may additionally include one or more sensors (e.g., IR sensors and motion detectors), input devices (e.g., microphone for capturing audio), and output devices (e.g., speaker for outputting audio).

Alternatively, in some implementations, the smart home environment 100 includes one or more network-connected microphone device 124 that are configured to capture audio and provide security functions in the smart home environment 100. Optionally, the microphone device 124 is a stand-alone device that is not included in any other smart device, and can be regarded as a type of smart device in this application. Optionally, the microphone device 124 is part of another smart electronic device (e.g., the cameras 118). The microphone device 124 may be used to determine occupancy of the structure 150 and/or particular rooms 152 in the structure 150, and thus may act as occupancy sensors. Specifically, audio captured by the microphone device 124 may be processed to identify the presence of an occupant in the structure 150 (e.g., in a particular room 152). Specific individuals may be identified based, for example, on characteristic of their voices.

The smart home environment 100 may additionally or alternatively include one or more other occupancy sensors (e.g., the smart doorbell 106, smart door locks 120, touch screens, IR sensors, microphones, ambient light sensors, motion detectors, smart nightlights 170, etc.). In some implementations, the smart home environment 100 includes radio-frequency identification (RFID) readers (e.g., in each room 152 or a portion thereof) that determine occupancy based on RFID tags located on or embedded in occupants. For example, RFID readers may be integrated into the smart hazard detectors 104.

The smart home environment 100 may also include communication with devices outside of the physical home but within a proximate geographical range of the home. For example, the smart home environment 100 may include a pool heater monitor 114 that communicates a current pool temperature to other devices within the smart home environment 100 and/or receives commands for controlling the pool temperature. Similarly, the smart home environment 100 may include an irrigation monitor 116 that communicates information regarding irrigation systems within the smart home environment 100 and/or receives control information for controlling such irrigation systems.

By virtue of network connectivity, one or more of the smart devices of FIG. 1 may further allow a user to interact with the smart devices even if the user is not proximate to the smart devices. For example, a user may communicate with a smart device using a computer (e.g., a desktop computer, laptop computer, or tablet) or other portable electronic device 166 (e.g., a mobile phone, such as a smart phone). A webpage or application may be configured to receive communications from the user and control the device based on the communications and/or to present information about the device's operation to the user. For example, the user may view a current set point temperature for a device (e.g., a stove) and adjust it using a computer. The user may be in the structure during this remote communication or outside the structure.

As discussed above, users may control smart devices in the smart home environment 100 using a network-connected computer or portable electronic device 166. In some examples, some or all of the occupants (e.g., individuals who live in the home) may register their device 166 with the smart home environment 100. Such registration may be made at a central server to authenticate the occupant and/or the device as being associated with the home and to give permission to the occupant to use the device to control the smart devices in the home. An occupant may use their registered device 166 to remotely control the smart devices of the home, such as when the occupant is at work or on vacation. The occupant may also use their registered device to control the smart devices when the occupant is actually located inside the home, such as when the occupant is sitting on a couch inside the home. It should be appreciated that instead of or in addition to registering devices 166, the smart home environment 100 may make inferences about which individuals live in the home and are therefore occupants and which devices 166 are associated with those individuals. As such, the smart home environment may "learn" who is an occupant and permit the devices 166 associated with those individuals to control the smart devices of the home.

In some implementations, in addition to containing processing and sensing capabilities, devices 102, 104, 106, 108, 110, 112, 114, 116, 118, 120, 122 and/or 124 (collectively referred to as "the smart devices") are capable of data communications and information sharing with other smart devices, a central server or cloud-computing system, and/or other devices that are network-connected. Data communications may be carried out using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

In some implementations, the smart devices serve as wireless or wired repeaters. In some implementations, a first one of the smart devices communicates with a second one of the smart devices via a wireless router. The smart devices may further communicate with each other via a connection (e.g., network interface 160) to a network, such as the Internet 162. Through the Internet 162, the smart devices may communicate with a smart home provider server system 164 (also called a central server system and/or a cloud-computing system herein). The smart home provider server system 164 may be associated with a manufacturer, support entity, or service provider associated with the smart device(s). In some implementations, a user is able to contact customer support using a smart device itself rather than needing to use other communication means, such as a telephone or Internet-connected computer. In some implementations, software updates are automatically sent from the smart home provider server system 164 to smart devices (e.g., when available, when purchased, or at routine intervals).

In some implementations, the network interface 160 includes a conventional network device (e.g., a router), and the smart home environment 100 of FIG. 1 includes a hub device 180 that is communicatively coupled to the network(s) 162 directly or via the network interface 160. The hub device 180 is further communicatively coupled to one or more of the above intelligent, multi-sensing, network-connected devices (e.g., smart devices of the smart home environment 100). Each of these smart devices optionally communicates with the hub device 180 using one or more radio communication networks available at least in the smart home environment 100 (e.g., ZigBee, Z-Wave, Insteon, Bluetooth, Wi-Fi and other radio communication networks). In some implementations, the hub device 180 and smart devices coupled with/to the hub device can be controlled and/or interacted with via an application running on a smart phone, household controller, laptop, tablet computer, game console or similar electronic device. In some implementations, a user of such controller application can view status of the hub device or coupled smart devices, configure the hub device to interoperate with smart devices newly introduced to the home network, commission new smart devices, and adjust or view settings of connected smart devices, etc. In some implementations, the hub device 180 extends capabilities of low capability smart device to match capabilities of the highly capable smart devices of the same type, integrates functionality of multiple different device types—even across different communication protocols, and is configured to streamline adding of new devices and commissioning of the hub device 180.

Further, each of the smart devices (e.g., devices 102, 104, 106, 108, 110, 112, 114, 116, 118, 120, 122 and/or 124) includes a plurality of electrical components configured to implement various functions, such as sensing, signal conditioning and processing, and data communication. While implementing these electrical functions, the electrical components generate heat that must be dissipated in a timely manner to avoid causing significant temperature increase that would compromise the performance of the smart device. Thus, in various implementations of the application, the smart device incorporates a cooling structure that is physically configured to improve its heat dissipation efficiency. Specifically, the cooling structure at least partially encloses the heat generating electrical components, and includes a base form and a plurality of surface features on its exterior surface. The base and the surface features are physically configured to allow an airflow created by a fan disposed at an air inlet end of the cooling structure to carry away the heat generated by the electrical components efficiently. More details of the cooling structure of the smart device are explained below with reference to FIGS. 2-10.

Figure 2:
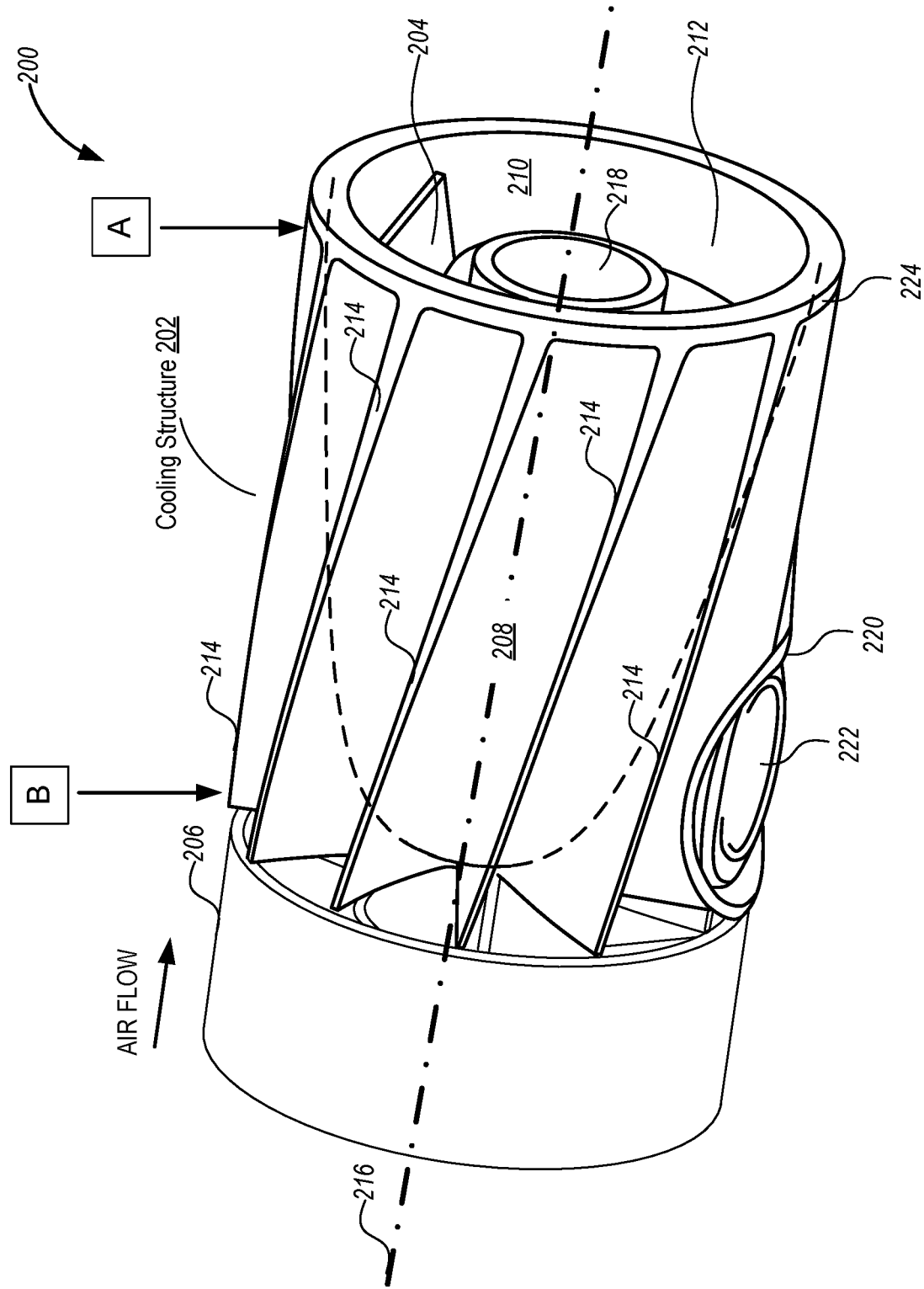
FIG. 2 is a perspective view of an electronic device assembly that includes a cooling structure in accordance with some implementations.

FIG. 2 is a perspective view of an electronic device assembly 200 that includes a cooling structure 202 in accordance with some implementations. The electronic device assembly 200 includes an enclosed cooling structure 202, a plurality of electrical components 204 and a powered fan 206. The cooling structure 202 is made from a thermally conductive material and has an exterior surface 208, an interior surface 210 and a hollow portion 212. The hollow portion 212 is defined by the interior surface 208, and has a substantially conical shape (i.e., a bullet shape). The plurality of electrical components 204 are contained within the hollow portion 212. The exterior surface 208 is configured to radiate away from the cooling structure 200 heat generated within the hollow portion 212 that is transmitted from the interior surface 210 to the exterior surface 208. As such, heat generated by the electrical components 204 during operation of the electronic device assembly 200 is carried away from the electrical components 204 by the cooling structure 202.

The exterior surface 208 includes a base form and a plurality of surface features 214 attached to the base form. The base form is also substantially conical. The plurality of surface features 214 project away from the base form and are physically configured to increase rate of thermal radiation from the exterior surface. The conical base form is physically configured to provide very low air pressure drop of the airflow as it flows across the exterior surface from the air inlet to the air outlet of the cooling structure.

Referring to FIG. 2, the fan 206 is disposed at a rear end of the cooling structure 202, and configured to generate an airflow along the exterior surface 208. The airflow is created around the rear end of the cooling structure 202, and therefore, the cooling structure 202 has an air inlet near the rear end, and an air outlet located at a front end of the cooling structure 202. The airflow is guided by the cooling structure 202 to flow from the air inlet to the air outlet and between every two adjacent surface features, carrying away heat accumulated in the cooling structure 202. As such, the airflow from the fan 206 moves heated air away from the exterior surface 208 of the cooling structure 202 so as to enhance cooling of the electrical components 204 during operation of these electrical components 204. It is also noted that the cooling structure 202 does not include any opening at the rear end and that little to no air flows into the hollow portion 212 to cause air to back up inside the cooling structure 202.

Further, in some implementations, the plurality of surface features includes fins with a length that extends substantially from the air inlet to the air outlet. The fins are physically configured to improve rate of thermal radiation from the exterior surface 208 and thereby provide additional cooling of the electrical components 214 during their operation. Further, in some implementations, the fins are physically configured such that the plurality of fins form a helical structure that wraps around the cooling structure, resulting curved surfaces of the fins producing substantially constant acceleration and reducing pressure drop of the airflow moving across the fins.

Referring to FIG. 2, in some implementations, the cooling structure 202 is substantially symmetrical with respect to a central axis 216, and includes an opening at a front end of the cooling structure 202. In a cross section including the central axis, each of the interior surface 210 and the base form of the exterior surface 208 has a respective parabolic shape that has an opening directed to the front end of the cooling structure 202. In some implementations, a camera lens 218 is disposed within the cooling structure 202. The camera lens 218 is configured to face outside towards the front end of the cooling structure 202, and receive incoming optical signals via the opening of the cooling structure 202.

In some implementations, the electronic device assembly 200 further includes a component (e.g., a speaker or a microphone) that needs to be exposed via a sidewall of the cooling structure 202. The cooling structure 202 includes a through hole 220 that penetrates its sidewall. The component (e.g., a speaker 222) is embedded in the through hole 220 and faces opposite from the hollow portion 212 of the cooling structure 202. Further, in some implementations, the electronic device assembly 200 is configured for wireless communications via one or more radios contained in the hollow portion 212, and the through hole 220 permits electrical connection between one of the radios and an antenna disposed outside the hollow portion 212.

In some implementations, the interior surface 210 of the cooling structure 202 is coated with a heat spreader layer or attached with a heat spreader structure. The heat spreader is made of a material having a substantially high thermal conductivity, such that it distributes heat generated by the plurality of electrical components 204 across the entire interior surface of the cooling structure 202. Optionally, the heat spreader is made of metal (e.g., Cu, W and Mo), metal composites or alloys (e.g. Cu—W and Cu—Mo), ceramics (e.g., AlN), ceramics-metal (e.g., Al—SiC and Si—SiC), synthetic diamonds or a combination of thereof.

In various implementations of the application, the electronic device assembly 200 includes one or more of a thermostat 102, a hazard detector 104, a doorbell 106, a wall switch 108, a wall plug 110, a pool heater monitor 114, an irrigation monitor 116, a camera, 118, a door lock, 120, an alarm device 122, a microphone device 124 and the like. The plurality of electrical components 204 of the electronic device assembly 200 includes one or more processors, and memory storing one or more programs for execution by the one or more processors to enable functionalities of the aforementioned smart devices. For a camera assembly, the plurality of electrical components includes at least one of a light emitting diode array, an image sensor array and an antenna.

Generally, the cooling structure 202 acts as a heat sink that dissipates the heat generated by the plurality of electrical components 204 enclosed therein. The cooling structure 202 is thermally conductive and has a substantially large thermal capacity. In some implementations, the cooling structure 202 is made of one of aluminum, aluminum alloys, copper and diamond.

Figure 3:
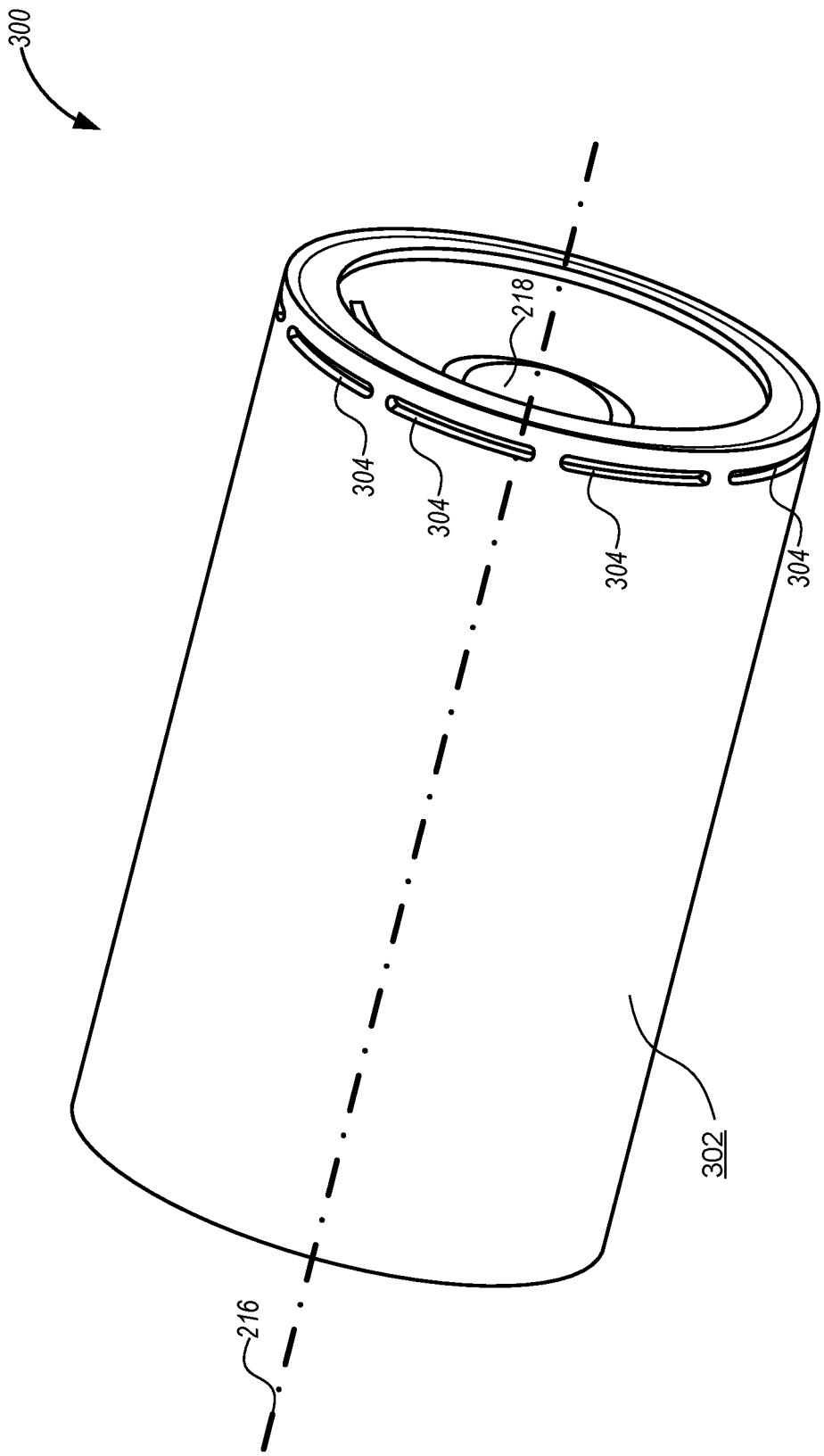
FIG. 3 is a perspective view of an electronic device assembly that is enclosed in an external housing in accordance with some implementations.

FIG. 3 is a perspective view of an electronic device assembly 300 that is enclosed in an external housing 302 in accordance with some implementations. The external housing 302 is substantially symmetrical with respect to the central axis 216. The symmetrical external housing 302 encloses the cooling structure 202 from at least the air inlet to the air outlet of the cooling structure 202. In some implementations, the surface features 214 (e.g., fins) are physically configured such that a top edge of each of the fins conforms to an inner envelope of the external housing 302. As such, the external housing 302 contains the airflow in proximity to the cooling structure 202 and the surface features 214. Alternatively, in some implementations, the external housing 302 is configured to enclose both the cooling structure 202 and the fan 206.

Further, the external housing 302 has an external envelope that has a substantially conical (not shown) or cylindrical shape. In some implementations, the external housing 302 is wrapped in a cooling shielding used to block heat from entering the electronic device assembly 200.

Referring to FIG. 2, in some implementations, the cooling structure 202 further includes an air outlet rim 224 at its front end, and the plurality of surface features 214 of the cooling structure 202 extends to and terminates at the air outlet rim 224. Further, in some implementations, the air outlet rim 224 includes a first fastener structure. Referring to FIG. 3, in some implementations the interior surface of the external housing 302 includes a second fastener structure that is located at a corresponding front end (i.e., near the air outlet) and matches the first fastener structure on the air outlet rim 224 of the cooling structure 202. When the first and second fastener structures are mechanically coupled to each other, the cooling structure 202 is fastened to the external housing 302.

In some implementations, the cooling structure 202 is entirely enclosed in the external housing 302, and includes one or more air outlet slots 304 carved at its front end. An airflow generated by the fan 206 enters an air inlet of the cooling structure 202, flows between the external housing 302 and the cooling structure 202, reaches an air outlet of the cooling structure 202, and exits the electronic device assembly 300 via the air outlet slots 304. As the airflow moves between the external housing 302 and the cooling structure 202, it experiences a very low air pressure drop and a constant acceleration.

Optionally, the external housing 302 is made of a thermally conductive material to enhance heat dissipation efficiency of the electronic device assembly 300.

Figure 4:
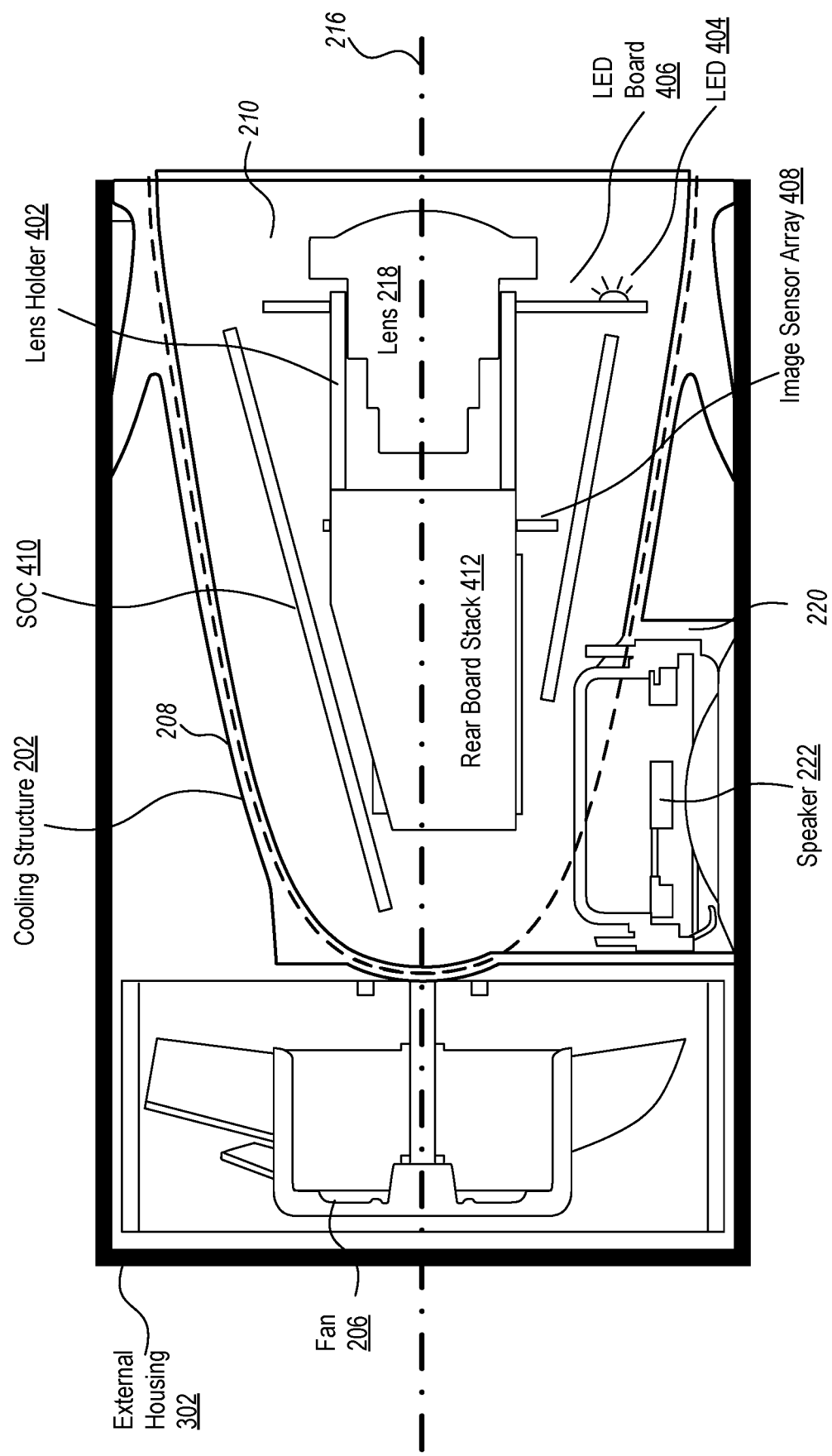
FIG. 4 is a cross sectional view of an electronic device assembly that includes components of an electronic device enclosed in a cooling structure and an external housing in accordance with some implementations.

FIG. 4 is a cross sectional view of an electronic device assembly 300 that includes components of an electronic device (e.g., a surveillance camera) enclosed in a cooling structure 202 and an external housing 302 in accordance with some implementations. The cross section shown in FIG. 4 includes the central axis 216. Each of the interior surface 210 and the base form of the exterior surface 208 has a respective parabolic shape that has an opening directed to an air outlet of the cooling structure 202. In some implementations, a camera lens 218 is disposed within the cooling structure 202. The camera lens 218 is supported by a lens holder 402, and configured to face outside towards the front end of the cooling structure 202 and receive incoming optical signals via the opening of the cooling structure 202.

The electronic device assembly 300 further includes one or more of light emitting diodes (LEDs) 404, LED board 406, an image sensor array 408, a system on chip (SoC) 410, and a rear board stack 412. Each of these components is contained within the cooling structure 202 of the electronic device assembly 300. In some implementations, all functional components of the electronic device assembly 300 are enclosed in the cooling structure 202. Alternatively, in some implementations, a subset (not all) of functional components of the electronic device assembly 300 are enclosed in the cooling structure 202, and some functional components (e.g., an antenna) are disposed outside the cooling structure 202 or the external housing 302. Further, in some implementations a component can be partially enclosed and partially exposed in the cooling structure 202.

Specifically, in some implementations, the electronic device assembly 300 further includes a component (e.g., a speaker 222, a microphone or an antenna) that needs to be at least partially exposed via a sidewall of the cooling structure 202. Part of the speaker 222 is exposed via a sidewall of the cooling structure 202. The cooling structure 202 includes a through hole 220 that penetrates its sidewall. The speaker 222 is embedded in the through hole 220 and faces opposite from the hollow portion 212 of the cooling structure 202. Further, in some implementations, the electronic device assembly 300 is configured for wireless communications via one or more radios contained in the hollow portion 212, and the through hole 220 permits electrical connection between one of the radios and an antenna disposed outside the hollow portion 212.

The fan 206 is disposed in proximity to the rear end of the cooling structure 202, and configured to generate an airflow that flows between the external housing 302 and the cooling structure 202. The airflow from the fan 206 moves heated air away from the exterior surface 208 of the cooling structure 202 so as to enhance cooling of the components enclosed in the cooling structure 202 during operation of the electronic device 300. It is also noted that the cooling structure 202 does not includes any opening at the rear end and that little to no air flows into the hollow portion 212 to cause air to back up inside.

Figure 5B:
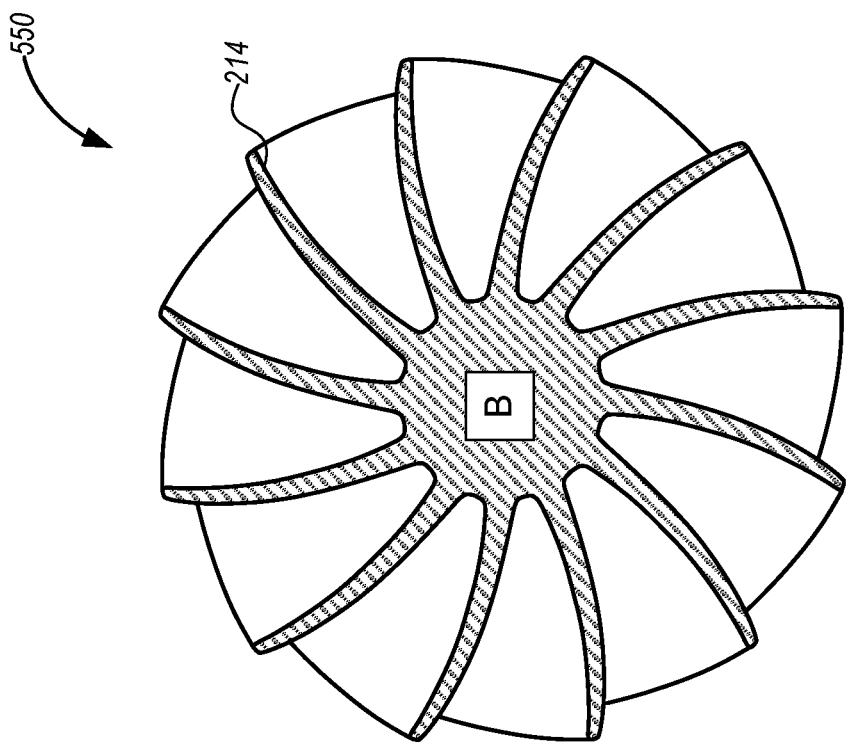
FIGS. 5A and 5B are two cross sectional views of a cooling structure at a front end and at a rear end in accordance with some implementations.
Figure 5A:
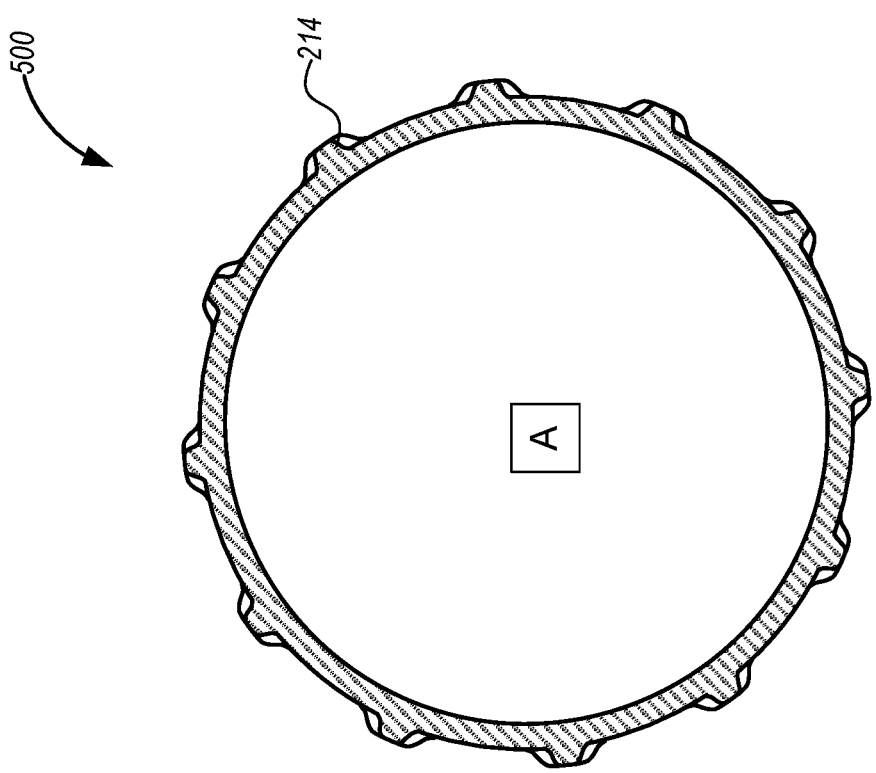

FIGS. 5A and 5B are two cross sectional views 500 and 550 of a cooling structure 202 at a front end and at a rear end in accordance with some implementations, respectively. The cooling structure 202 includes a plurality of cross sections including cross sections A and B, and each of the plurality of cross sections intersects the central axis 216. Cross sections A and B are located at the front and rear ends of the cooling structure 202, respectively, and are substantially perpendicular to the central axis 216. In this specific example, the cooling structure 202 includes twelve surface features 214 (e.g., fins) that extend from the rear end to the front end (i.e., from an air inlet to an air outlet). Each of the fins is physically configured to form a helical structure that wraps around the cooling structure 202. Optionally, each fin has a height that decreases as the respective fin extends from the rear end to the front end, i.e., a first height of each fin on the cross section B is substantially larger than a second height of the respective fin close to the cross section A. In some implementations, each fin has a tapered width from its base to its tip as shown on the cross section B. In some implementations, each fin has an average width that increases as the respective fin extends from the rear end to the front end, i.e., a first average width of each fin on the cross section B is substantially smaller than a second average width of the respective fin close to the cross section A. In some implementations, the fins are identical, and symmetrically arranged on a base form of the cooling structure 202 with respect to the central axis 216.

In some implementations, at each cross section perpendicular to the central axis 216 (e.g., cross section B), each of the fins has two sides that together form a first parabolic shape, i.e., the exterior surface between every two adjacent fins has a second parabolic shape. Optionally, each of the first and second parabolic shapes tilts towards a clockwise or counterclockwise direction. In some implementations, the degree of tilting varies for fins at different locations of the central axis 216. In an example implementation, the degree of tilting increases as the fins extends close to the front end of the cooling structure 202.

In some implementations, the cooling structure 202 includes an air outlet rim (e.g., the air outlet rim 224 as shown in FIG. 2) at the front end. When the air outlet rim has a height larger than that of the surface features 214 at the front end, the surface features 214 cannot be seen on the cross section A of the cooling structure 202.

It should be understood that the cooling structure 202, the external housing 206 and the components contained therein as described in this application are merely examples and are not intended to indicate that they are the only cooling structures, external housings and contained components that can be implemented in accordance with this application. One of ordinary skill in the art would recognize various ways to form an electronic device assembly based on a cooling structure 202 as described herein. Additionally, it should be noted that details of the electronic device assembly 200 described herein with respect to FIGS. 2-5 are applicable in an analogous manner to other electronic device assemblies described herein with respect to FIGS. 6-10. For brevity, these details are not repeated for the electronic device assemblies described with respect to FIGS. 6-10.

In summary, as shown in FIGS. 2-5, this application discloses at least a heat sink with a conical shape that has helically wrapped parabolic fins. A fan is placed at the apex of the conical shape, and air is moved over the heat sink like an airfoil. This allows for maximum fluid flow attachment across the cone, which allows for efficient and effective cooling. Parabolic fins, by their very nature, are more efficient than straight fins when the geometry of the heat sink allows for such a design. This is because, as the area of the cone varies, so to does the area of the fin. Also, because the fins are also wrapped helically, there is a combination effect of maximized fin efficiency and maximized fluid cooling effectiveness.

Figure 6:
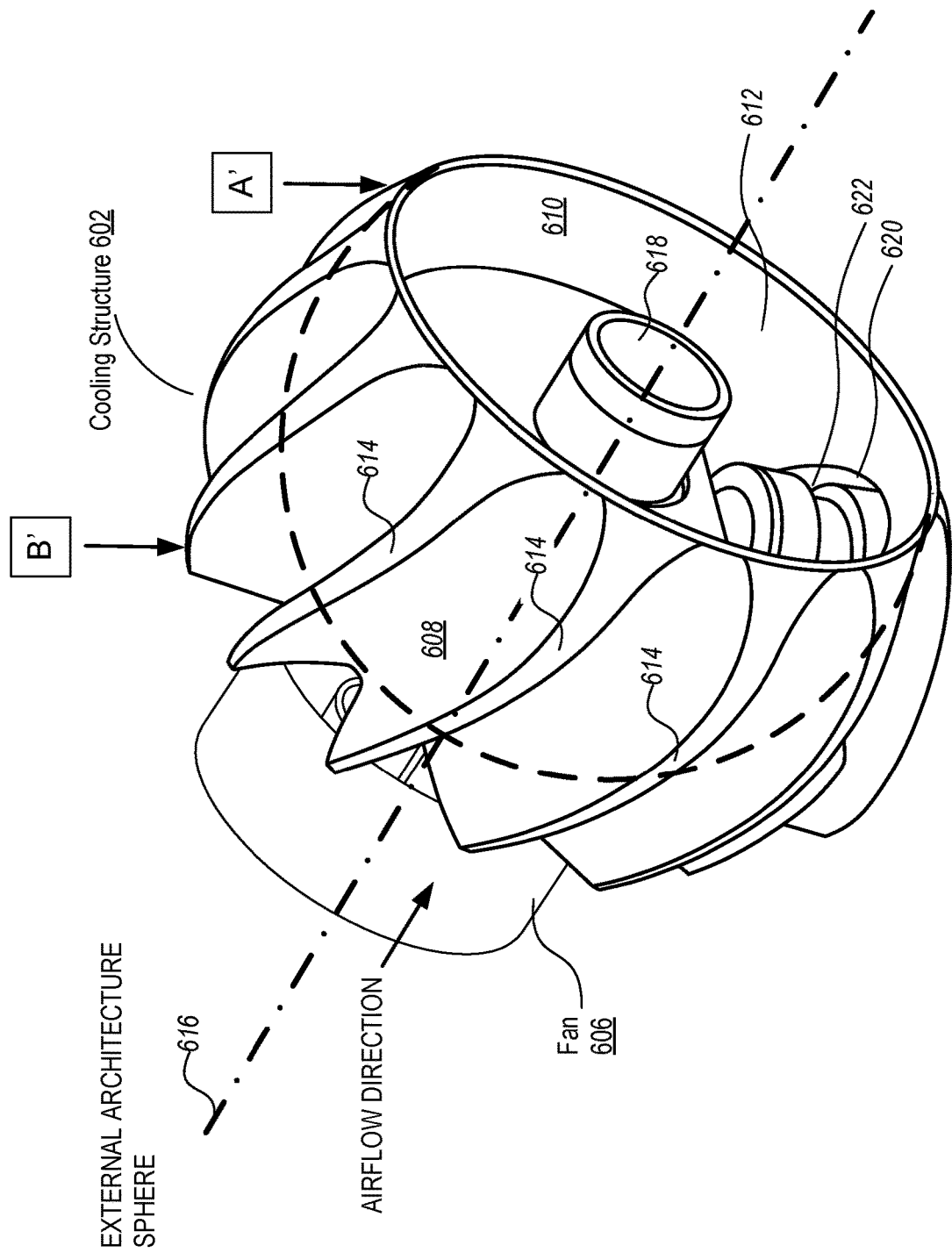
FIG. 6 is a perspective view of another electronic device assembly that includes a cooling structure in accordance with some implementations.

FIG. 6 is a perspective view of an electronic device assembly 600 that includes a cooling structure in accordance with some implementations. The electronic device assembly 600 includes an enclosed cooling structure 602, a plurality of electrical components (not shown) and a fan 606. The cooling structure 602 is made from a thermally conductive material and has an exterior surface 608, an interior surface 610 and a hollow portion 612. The hollow portion 612 is defined by the interior surface 608, and has a substantially radial shape. The plurality of electrical components are contained within the hollow portion 612. The exterior surface 608 is configured to radiate away from the cooling structure 600 heat generated within the hollow portion 612 that is transmitted from the interior surface 610 to the exterior surface 608. As such, heat generated by the electrical components during operation of the electronic device assembly 600 is carried away from the electrical components by the cooling structure 602.

The exterior surface 608 includes a base form and a plurality of surface features 614 attached to the base form. Optionally, the base form is also substantially radial. The plurality of surface features 614 project away from the base form and are physically configured to increase rate of thermal radiation from the exterior surface 608. The base form is physically configured to provide very low air pressure drop of the airflow as it flows across the exterior surface from the air inlet to the air outlet of the cooling structure.

Referring to FIG. 6, the fan 606 is disposed at a rear end of the cooling structure 602, and configured to generate an airflow along the exterior surface 608. The airflow is created around the rear end of the cooling structure 602, and therefore, the cooling structure 602 has an air inlet near the rear end, and an air outlet located at a front end of the cooling structure 602. The airflow is guided by the cooling structure 602 to flow from the air inlet to the air outlet and between every two adjacent surface features 614, carrying away heat accumulated in the cooling structure 602. Further, in some implementations, the plurality of surface features 614 includes fins with a length that extends substantially from the air inlet to the air outlet. In some implementations, the fins are physically configured such that the plurality of fins form a helical structure that wraps around the cooling structure, resulting curved surfaces of the fins producing substantially constant acceleration and reducing pressure drop of the airflow moving across the fins. More details on the fan 606 and the surface features 614 are explained above with reference to FIG. 2.

Referring to FIG. 6, in some implementations, the cooling structure 602 is substantially symmetrical with respect to a central axis 616, and includes an opening at a front end of the cooling structure 602. In a cross section including the central axis 616, each of the interior surface 610 and the base form of the exterior surface 608 has a respective spherical shape that has an opening directed to the front end of the cooling structure 602. Alternatively, in some implementations shown in FIG. 8, each of the interior surface 610 and the base form of the exterior surface 608 has a respective parabolic shape that has an opening directed to the front end of the cooling structure 602.

In some implementations, a camera lens 618 is disposed within the cooling structure 602. The camera lens 618 is configured to face outside towards the front end of the cooling structure 602, and receive incoming optical signals via the opening of the cooling structure 602. In some implementations, the cooling structure 602 includes a through hole 620 that penetrates its sidewall. A component (e.g., a speaker, a microphone or a communication antenna) is embedded in the through hole 620 and faces opposite from the hollow portion 612 of the cooling structure 602. More details on the speaker, the microphone or the communication antenna embedded in the through hole 620 are explained above with reference to FIG. 2.

In various implementations of the application, the electronic device assembly 600 includes one or more of a thermostat 102, a hazard detector 104, a doorbell 106, a wall switch 108, a wall plug 110, a pool heater monitor 114, an irrigation monitor 116, a camera, 118, a door lock, 120, an alarm device 122, a microphone device 124 and the like. The plurality of electrical components of the electronic device assembly 600 includes one or more processors, and memory storing one or more programs for execution by the one or more processors to enable functionalities of the aforementioned smart devices. For a camera assembly 600, the plurality of electrical components includes at least one of a light emitting diode array, an image sensor array and an antenna.

Figure 7:
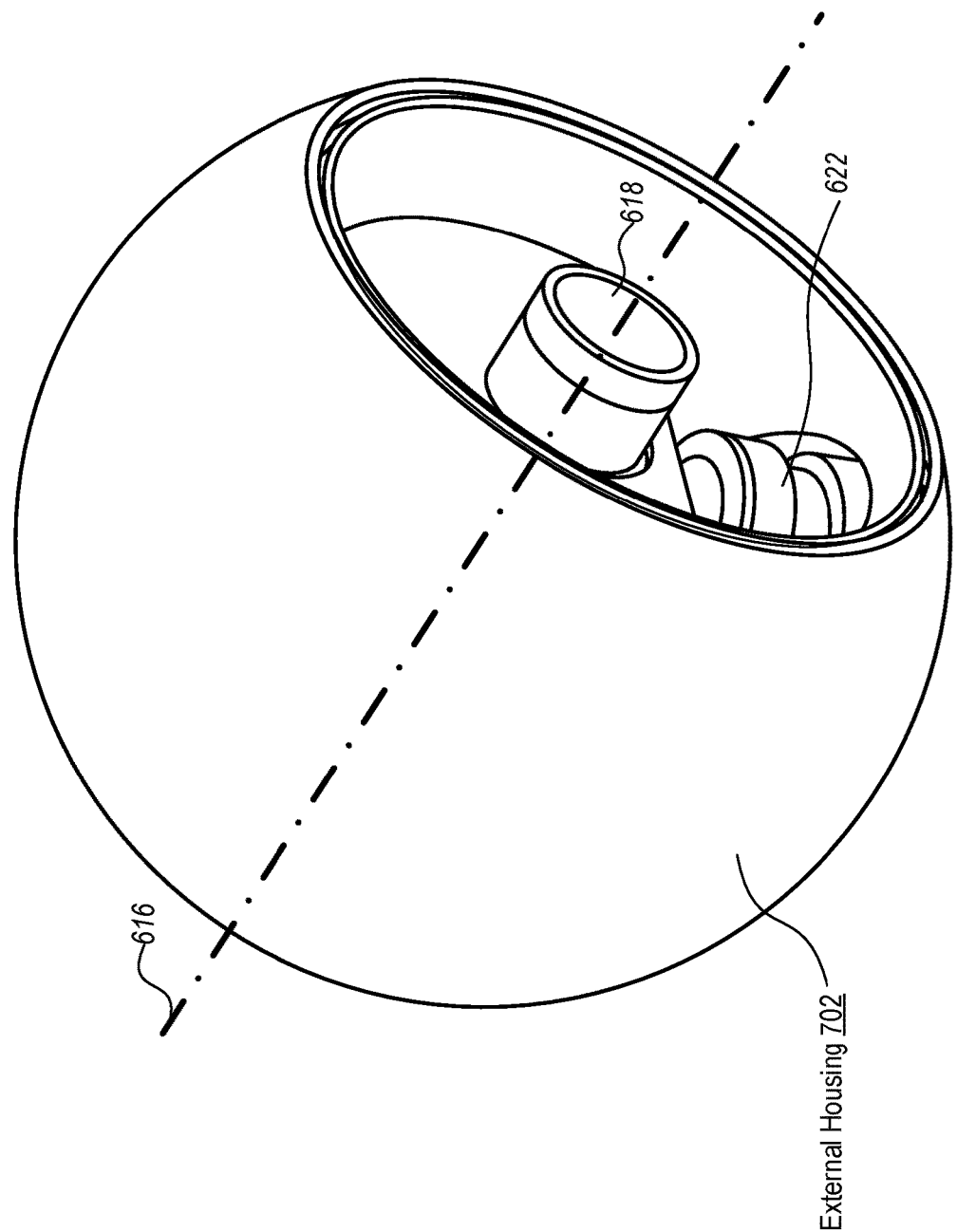
FIG. 7 is a perspective view of another electronic device assembly that is enclosed in an external housing in accordance with some implementations.

FIG. 7 is a perspective view of another electronic device assembly 700 that is enclosed in an external housing 702 in accordance with some implementations. The external housing 702 encloses the cooling structure 602 from at least the air inlet to the air outlet of the cooling structure 602. The surface features 614 (e.g., fins) are physically configured such that a top edge of each of the fins conforms to an inner envelope of the external housing 702. As such, the external housing 702 contains the airflow in proximity to the cooling structure 602 and the surface features 614. Alternatively, in some implementations, the external housing 702 is configured to enclose both the cooling structure 602 and the fan 606. Further, the external housing 702 has an external envelope that has a substantially spherical shape. In some implementations, the external housing 702 is wrapped in a cooling shielding used to block heat from entering the electronic device 600. More details on the external housing 702 is explained above with reference to FIG. 3.

Figure 8:
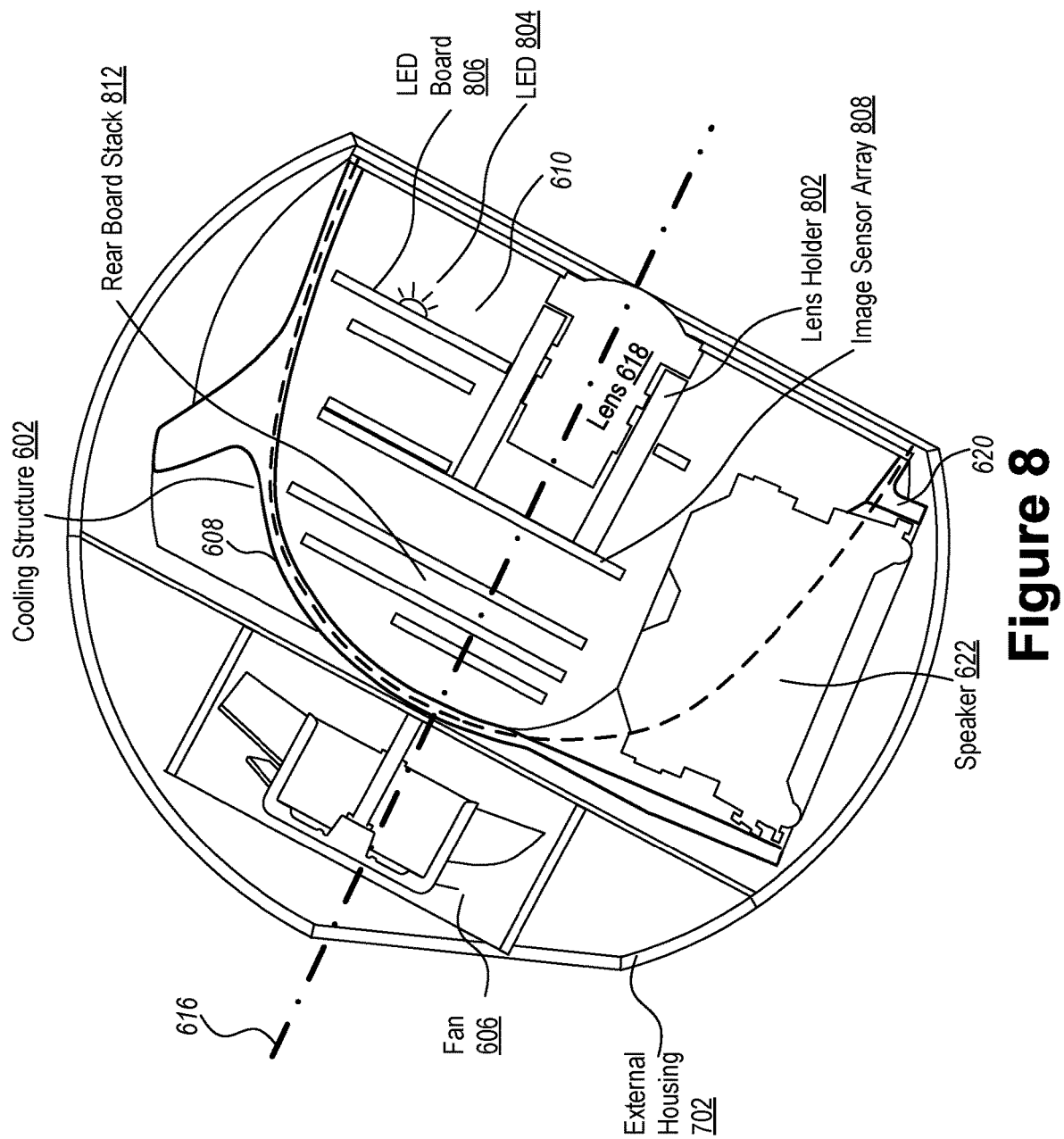
FIG. 8 is a cross sectional view of another electronic device assembly that includes components of an electronic device enclosed in a cooling structure and an external housing in accordance with some implementations.

FIG. 8 is a cross sectional view of an electronic device assembly 700 that includes components of an electronic device (e.g., a surveillance camera) enclosed in a cooling structure 602 and an external housing 702 in accordance with some implementations. The cross section shown in FIG. 8 includes the central axis 616. Each of the interior surface 610 and the base form of the exterior surface 608 has a spherical or parabolic shape that has an opening directed to an air outlet of the cooling structure 602. In some implementations, a camera lens 618 is disposed within the cooling structure 602. The camera lens 618 is supported by a lens holder 402, and configured to face outside towards the front end of the cooling structure 602, and receive incoming optical signals via the opening of the cooling structure 602.

The electronic device assembly 300 further includes one or more of light emitting diodes (LEDs) 804, LED board 806, an image sensor array 808, a system on chip (SoC) 810, and a rear board stack 812. Each of these components is contained within the cooling structure 602 of the electronic device assembly 700.

In some implementations, the electronic device assembly 700 further includes a component (e.g., a speaker 622, a microphone or an antenna) that needs to be at least partially exposed via a sidewall of the cooling structure 602. Part of the speaker 622 is exposed via a sidewall of the cooling structure 602. The cooling structure 602 includes a through hole 620 that penetrates its sidewall. The speaker 622 is embedded in the through hole 620 and faces opposite from the hollow portion 612 of the cooling structure 602. Further, in some implementations, the electronic device assembly 300 is configured for wireless communications via one or more radios contained in the hollow portion 612, and the through hole 620 permits electrical connection between one of the radios and an antenna disposed outside the hollow portion 612.

The fan 606 is disposed in proximity to a rear end of the cooling structure 602, and configured to generate an airflow that flows between the external housing 302 and the cooling structure 602. The airflow from the fan 606 moves heated air away from the exterior surface 608 of the cooling structure 602 so as to enhance cooling of the components enclosed in the cooling structure 602 during operation of the electronic device 300. It is also noted that the cooling structure 602 does not includes any opening at the rear end and that little to no air flows into the hollow portion 612 to cause air to back up inside.

Figure 9B:
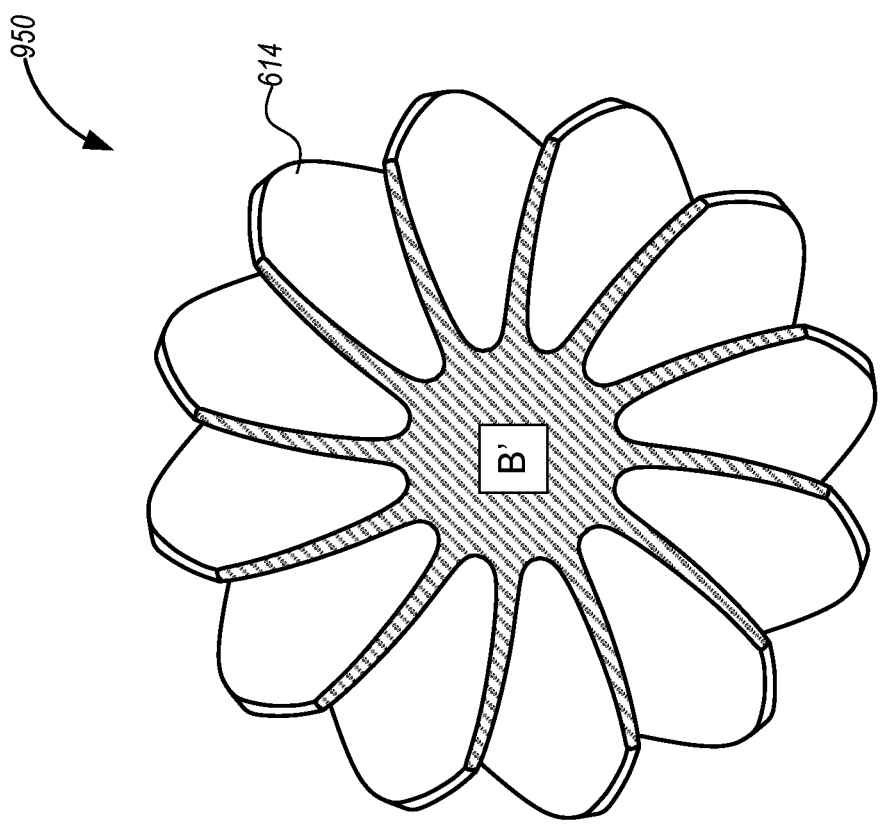
FIGS. 9A and 9B are two cross sectional views of another cooling structure at a front end and at a rear end in accordance with some implementations.
Figure 9A:
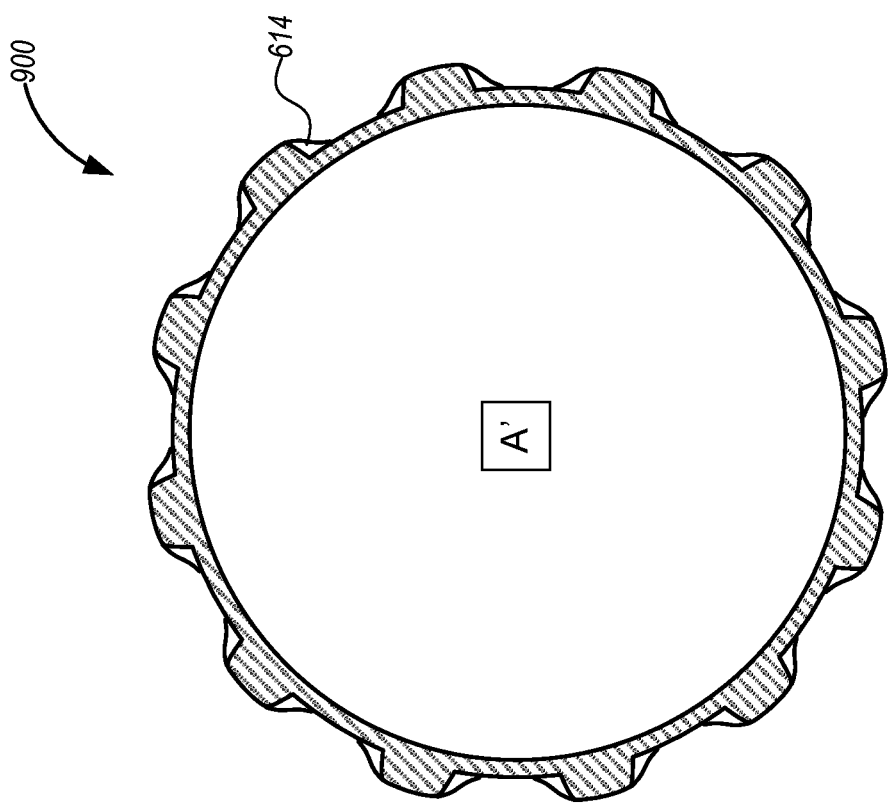

FIGS. 9A and 9B are two cross sectional views 900 and 950 of another cooling structure 602 at a front location and at a rear location in accordance with some implementations, respectively. The cooling structure 602 includes a plurality of cross sections including cross sections A' and B', and each of the plurality of cross sections intersects the central axis 216. Cross sections A' and B' are located at the front and rear ends of the cooling structure 602, and are perpendicular to the central axis 616. In this specific example, the cooling structure 602 includes twelve surface features 614 (e.g., fins) that extend from the rear end to the front end (i.e., from an air inlet to an air outlet). Each of the fins is physically configured to form a helical structure that wraps around the cooling structure 602. Optionally, each fin has a height that decreases as the respective fin extends from the rear end to the front end, i.e., a first height of each fin on the cross section B' is substantially larger than a second height of the respective fin close to the cross section A'. In some implementations, each fin has a tapered width from its base to its tip as shown on the cross section B'. Optionally, each fin has an average width that increases as the respective fin extends from the rear end to the front end, i.e., a first average width of each fin on the cross section B' is substantially smaller than a second average width of the respective fin close to the cross section A'. In some implementations, the fins are identical, and symmetrically arranged on a base form of the cooling structure 602 with respect to the central axis 616.

In some implementations, at each cross section perpendicular to the central axis 616 (e.g., cross section B'), each of the fins has two sides that together form a first parabolic shape, i.e., the exterior surface between every two adjacent fins has a second parabolic shape. Optionally, each of the first and second parabolic shapes tilts towards a clockwise or counterclockwise direction. In some implementations, the degree of tilting varies for fins at different locations of the central axis 616. In an example, the degree of tilting increases as the fins extends close to the front end of the cooling structure 602.

Alternatively, in some implementations, the cooling structure 602 includes an air outlet rim at the front end. When the air outlet rim has a height larger than that of the surface features 614 at the front end, the surface features 614 cannot be seen on the cross section A' of the cooling structure 602.

It should be understood that the cooling structure 602, the external housing 606 and the components contained therein are merely exemplary and are not intended to indicate that they are the only cooling structures, external housings and contained components that can be implemented in this application. One of ordinary skill in the art would recognize various ways to form an electronic device assembly based on a cooling structure 602 as described herein. Additionally, it should be noted that details of the electronic device assembly 600 described herein with respect to FIGS. 6-9 are applicable in an analogous manner to other electronic device assemblies described herein with respect to FIGS. 2-5 and 10. For brevity, these details are not repeated for the electronic device assemblies described with respect to FIGS. 2-5 and 10.

Figure 10:
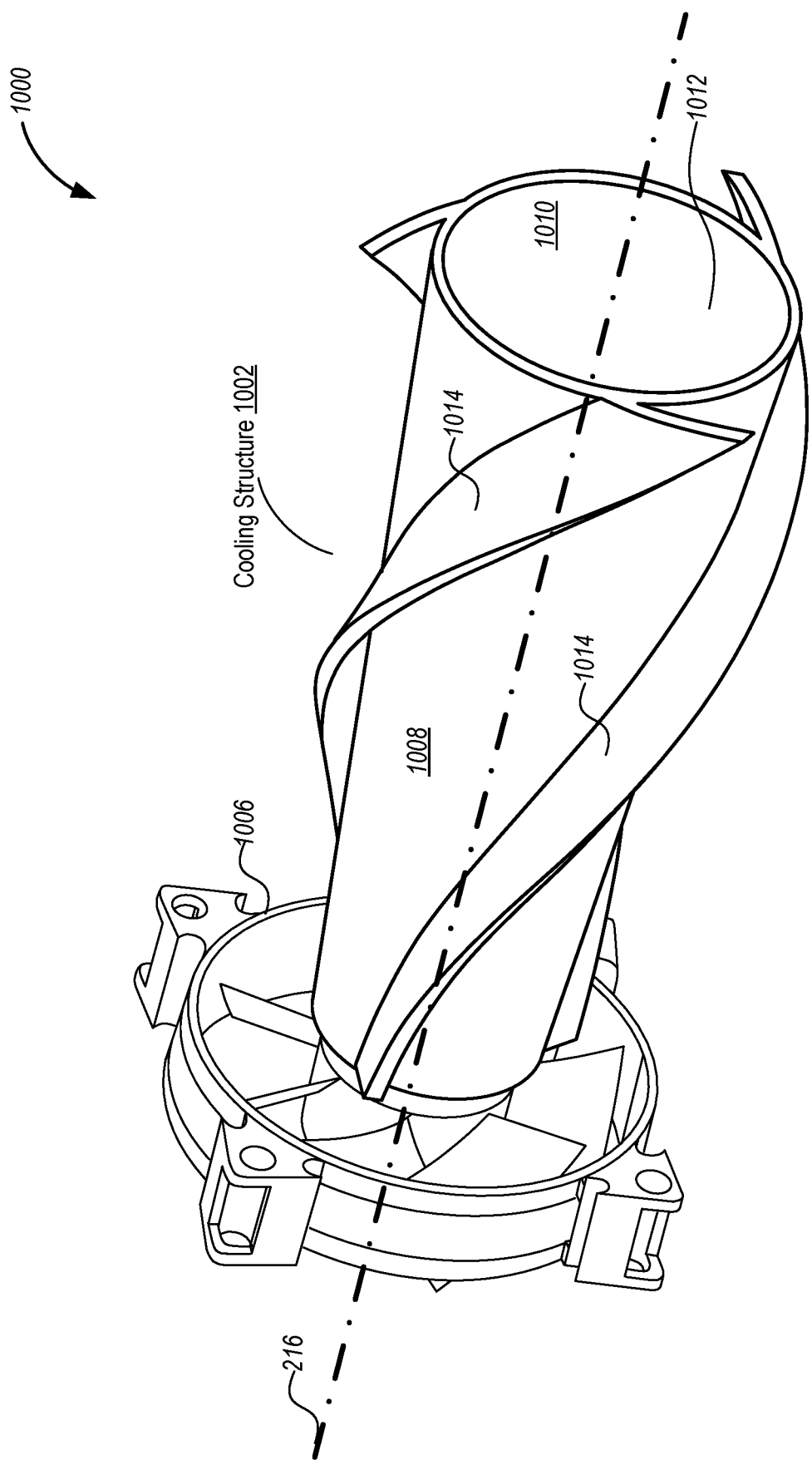
FIG. 10 is a perspective view of another electronic device assembly that includes a cooling structure in accordance with some implementations.

FIG. 10 is a perspective view of another electronic device assembly 1000 that includes a cooling structure 1002 in accordance with some implementations. The electronic device assembly 1000 includes an enclosed cooling structure 1002, a plurality of electrical components 1004 and a fan 1006. The cooling structure 1002 is made from a thermally conductive material and has an exterior surface 1008, an interior surface 1010 and a hollow portion 1012. The hollow portion 1012 is defined by the interior surface 1008, and has a substantially cylindrical shape. The plurality of electrical components 1004 are contained within the hollow portion 1012. The exterior surface 1008 is configured to radiate away from the cooling structure 1000 heat generated within the hollow portion 1012 that is transmitted from the interior surface 1010 to the exterior surface 1008. As such, heat generated by the electrical components 1004 during operation of the electronic device assembly 1000 is carried away from the electrical components 1004 by the cooling structure 1002.

The exterior surface 1008 includes a base form and a plurality of surface features 1014 attached to the base form. Optionally, the base form is also substantially cylindrical. The plurality of surface features 1014 project away from the base form and are physically configured to increase rate of thermal radiation from the exterior surface 1008. The base form is physically configured to provide very low air pressure drop of the airflow as it flows across the exterior surface from the air inlet to the air outlet of the cooling structure.

Referring to FIG. 10, the fan 1006 is disposed at a rear end of the cooling structure 1002, and configured to generate an airflow along the exterior surface 1008. The airflow is created around the rear end of the cooling structure 1002, and therefore, the cooling structure 1002 has an air inlet near the rear end, and an air outlet located at a front end of the cooling structure 1002. The airflow is guided by the cooling structure 1002 to flow from the air inlet to the air outlet and between every two adjacent surface features 1014, carrying away heat accumulated in the cooling structure 1002. Further, in some implementations, the plurality of surface features 1014 includes fins with a length that extends substantially from the air inlet to the air outlet. In some implementations, the fins are physically configured such that the plurality of fins form a helical structure that wraps around the cooling structure, resulting curved surfaces of the fins producing substantially constant acceleration and reducing pressure drop of the airflow moving across the fins. More details on the fan 1006 and the surface features 1014 are explained above with reference to FIG. 2.

Referring to FIG. 10, in some implementations the cooling structure 1002 is substantially symmetrical with respect to a central axis 1016, and includes an opening at a front end of the cooling structure 1002. In a cross section including the central axis, each of the interior surface 1010 and the base form of the exterior surface 1008 has a respective cylindrical shape that has an opening directed to the front end of the cooling structure 1002.

In various implementations of the application, the electronic device assembly 1000 includes one or more of a thermostat 102, a hazard detector 104, a doorbell 106, a wall switch 108, a wall plug 110, a pool heater monitor 114, an irrigation monitor 116, a camera, 118, a door lock, 120, an alarm device 122, a microphone device 124 and the like. The plurality of electrical components 1004 of the electronic device assembly 1000 includes one or more processors, and memory storing one or more programs for execution by the one or more processors to enable functionalities of the aforementioned smart devices. For a camera based assembly 1000, the plurality of electrical components includes at least one of a light emitting diode array, an image sensor array and an antenna.

It should be understood that the cooling structure 1002, the external housing 1006 and the components contained therein are merely exemplary and are not intended to indicate that they are the only cooling structures, external housings and contained components that can be implemented in this application. One of ordinary skill in the art would recognize various ways to form an electronic device assembly based on a cooling structure 1002 as described herein. Additionally, it should be noted that details of the electronic device assembly 1000 described herein with respect to FIG. 10 are applicable in an analogous manner to other electronic device assemblies described herein with respect to FIGS. 2-9. For brevity, these details are not repeated for the electronic device assemblies described with respect to FIGS. 2-9.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, mechanical structures, circuits, and networks have not been described in detail so as not to unnecessarily obscure aspects of the implementations.

It will also be understood that, although the terms first, second, etc. are, in some instances, used herein to describe various elements, these elements should not be limited by these terms. These terms are only used to distinguish one element from another. For example, a first fastener structure can be termed a second fastener structure, and, similarly, a second fastener structure can be termed a first fastener structure, without departing from the scope of the various described implementations. The first fastener structure and the second fastener structure are both fastener structures, but they are not the same fastener structure.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, components, structures and/or groups, but do not preclude the presence or addition of one or more other features, integers, steps, operations, elements, components, structures, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

It is to be appreciated that "smart home environments" may refer to smart environments for homes such as a single-family house, but the scope of the present teachings is not so limited. The present teachings are also applicable, without limitation, to duplexes, townhomes, multi-unit apartment buildings, hotels, retail stores, office buildings, industrial buildings, and more generally any living space or work space.

It is noted that the stand assemblies described herein are exemplary and are not intended to be limiting. For example, any dimensions, shapes, styles, and/or materials described herein are exemplary and are not intended to be limiting. Drawings are not to scale. For brevity, features or characters described in association with some implementations may not necessarily be repeated or reiterated when describing other implementations. Even though it may not be explicitly described therein, a feature or characteristic described in association with some implementations may be used by other implementations.

What is claimed is:

1. A camera system, comprising:
   a cooling structure made from a thermally conductive material and having an exterior surface, an interior surface, a hollow portion defined by the interior surface, and a sidewall formed by a portion of the exterior surface and a portion of the interior surface, wherein:
      the sidewall includes a through hole that penetrates the sidewall; and
      the exterior surface includes a plurality of surface features and is configured to radiate away from the cooling structure heat generated within the hollow portion that is transmitted from the interior surface to the exterior surface;
   a camera contained within the hollow portion of the cooling structure;
   a first electrical device that is embedded in the through hole and is partially exposed via the sidewall, wherein the first electrical device is one of: a speaker, a microphone, and an antenna;
   a plurality of electrical components, distinct from the first electrical device, wherein the plurality of electrical components is contained within the hollow portion such that heat generated by the electrical components during operation of the camera system is carried away from the electrical components by the cooling structure; and
   an external housing that at least partially encloses the cooling structure.

2. The camera system of claim 1, wherein:
   the first electrical device is the speaker; and
   the speaker faces opposite from the hollow portion of the cooling structure.

3. The camera system of claim 1, wherein the plurality of surface features is physically configured such that a top edge of each of the surface features conforms to an inner envelope of the external housing, and the external housing contains airflow in proximity to the plurality of surface features of the cooling structure as air flows across the exterior surface of the cooling structure.

4. The camera system of claim 1, wherein:
the cooling structure has an air inlet and an air outlet;
the plurality of surface features include fins with a length that extends substantially from the air inlet to the air outlet; and
the fins are physically configured to improve rate of thermal radiation from the exterior surface and thereby provide additional cooling of the electrical components during operation of the camera system.

5. The camera system of claim 1, wherein:
the cooling structure comprises one or more air outlet slots at a front end of the cooling structure and a fan at a rear end of the cooling structure; and
airflow generated by the fan flows between the external housing and the cooling structure and exits the camera system via the one or more air outlet slots.

6. The camera system of claim 1, wherein:
the exterior surface comprises a base form;
the plurality of surface features are attached to the base form; and
a portion of the base form has a shape that is radial.

7. The camera system of claim 4, wherein the fins are physically configured such that the plurality of fins form a helical structure that wraps around the cooling structure.

8. The camera system of claim 5, wherein:
the front end of the cooling structure is open;
the camera includes a camera lens and a holder for the camera lens; and
the camera lens is configured to face the front end and to receive incoming optical signals via the front end.

9. An electronic device, comprising:
a cooling structure made from a thermally conductive material and having an exterior surface, an interior surface, a hollow portion defined by the interior surface, and a sidewall formed by a portion of the exterior surface and a portion of the interior surface, wherein:
the sidewall includes a through hole that penetrates the sidewall; and
the exterior surface includes a plurality of surface features that are configured to radiate away from the cooling structure heat generated within the hollow portion that is transmitted from the interior surface to the exterior surface;
a first electrical device that is at least partially outside the cooling structure and is accessed by the through hole; and
a plurality of electrical components, distinct from the first electrical device, wherein the plurality of electrical components is contained within the hollow portion such that heat generated by the electrical components during operation of the electronic device is carried away from the electrical components by the cooling structure;
wherein the electronic device is configured for wireless communications via one or more radios contained in the hollow portion, and the through hole permits electrical connection between at least one of the radios contained in the hollow portion and an antenna disposed outside the hollow portion.

10. The electronic device of claim 9, wherein the exterior surface comprises a base form having a shape that is radial.

11. The electronic device of claim 10, wherein a portion of the base form has a shape that is cylindrical.

12. The electronic device of claim 9, wherein:
the cooling structure is symmetrical and further comprises an air inlet and an air outlet;
the plurality of surface features include fins with a length that extends substantially from the air inlet to the air outlet; and
the fins are physically configured to improve rate of thermal radiation from the exterior surface and thereby provide additional cooling of the electrical components during operation of the electronic device.

13. The electronic device of claim 10, wherein a portion of the base form has a shape that is conical and is physically configured to provide very low air pressure drop of airflow as it flows across the exterior surface from an air inlet to an air outlet of the cooling structure.

14. The electronic device of claim 9, wherein the through hole embeds the first electrical device.

15. The electronic device of claim 12, wherein the fins are physically configured such that the fins form a helical structure that wraps around the cooling structure, the resulting curved surfaces of the fins producing substantially constant acceleration and reducing pressure drop of the airflow moving across the fins.

16. An electronic device, comprising:
a cooling structure made from a thermally conductive material and having an air inlet located at a rear end, an air outlet located at a front end, an exterior surface, an interior surface and a hollow portion defined by the interior surface, and a sidewall formed by a portion of the exterior surface and a portion of the interior surface, wherein:
the sidewall includes a through hole that penetrates the sidewall;
the cooling structure does not include any opening at the rear end; and
the exterior surface is configured to radiate away from the cooling structure heat generated within the hollow portion that is transmitted from the interior surface to the exterior surface;
a plurality of electrical components that is contained within the hollow portion;
a first electrical component that is embedded in the through hole and is partially exposed via the sidewall, wherein the first electrical component distinct from the plurality of electrical components; and
a fan disposed in proximity to the rear end of the cooling structure and configured to generate an airflow such that heat generated by the electrical components during operation of the electronic device is carried away from the electrical components at least partially by the fan.

17. The electronic device of claim 16, wherein the electronic device comprises an external housing that houses the cooling structure, and the airflow flows between the external housing and the cooling structure.

18. The electronic device of claim 16, further comprising a camera lens contained within the hollow portion, wherein the plurality of electrical components include at least one of a light emitting diode array, an image sensor array, and an antenna.

19. A camera system, comprising:
a cooling structure made from a thermally conductive material and having an exterior surface, an interior surface, a hollow portion defined by the interior surface, and a sidewall formed by a portion of the exterior surface and a portion of the interior surface, wherein:
the sidewall includes a through hole that that penetrates the sidewall;
the exterior surface includes a plurality of surface features and is configured to radiate away from the cooling structure heat generated within the hollow portion that is transmitted from the interior surface to the exterior surface; and the plurality of surface features is physically configured such that a top edge of each of the surface features conforms to an inner envelope of the external housing, and the external housing contains airflow in proximity to the plurality of surface features of the cooling structure as air flows across the exterior surface of the cooling structure;

a camera contained within the hollow portion of the cooling structure;

a first electrical device that is embedded in the through hole and is partially exposed via the sidewall;

a plurality of electrical components, distinct from the first electrical device, wherein the plurality of electrical components is contained within the hollow portion such that heat generated by the electrical components during operation of the camera system is carried away from the electrical components by the cooling structure; and an external housing that at least partially encloses the cooling structure.

* * * * *